United States Patent
Xiao

(10) Patent No.: US 12,024,196 B2
(45) Date of Patent: Jul. 2, 2024

(54) SIMULATION TEST METHOD FOR AUTONOMOUS DRIVING VEHICLE, COMPUTER EQUIPMENT AND MEDIUM

(71) Applicant: SHENZHEN GUO DONG INTELLIGENT DRIVE TECHNOLOGIES CO., LTD, Shenzhen (CN)

(72) Inventor: Jianxiong Xiao, Shenzhen (CN)

(73) Assignee: SHENZHEN GUO DONG INTELLIGENT DRIVE TECHNOLOGIES CO., LTD, Shenzhen (CN)

( * ) Notice: Subject to any disclaimer, the term of this patent is extended or adjusted under 35 U.S.C. 154(b) by 439 days.

(21) Appl. No.: 17/341,415

(22) Filed: Jun. 8, 2021

(65) Prior Publication Data

US 2021/0394787 A1    Dec. 23, 2021

(30) Foreign Application Priority Data

Jun. 17, 2020    (CN) .......................... 202010552057.8

(51) Int. Cl.
   *B60W 60/00*    (2020.01)
   *B60W 40/10*    (2012.01)
   (Continued)

(52) U.S. Cl.
   CPC ........ *B60W 60/0011* (2020.02); *B60W 40/10* (2013.01); *B60W 60/0027* (2020.02);
   (Continued)

(58) Field of Classification Search
   CPC ......... B60W 60/0011; B60W 60/0027; B60W 40/10; B60W 2554/4041; G06F 30/20; G01M 17/00
   (Continued)

(56) References Cited

U.S. PATENT DOCUMENTS 8,108,092 B2 *   1/2012   Phillips ................ G05D 1/0278
                                                                701/2
11,354,458 B1 *   6/2022   Schwalb ................ G06N 3/006
                           (Continued)

FOREIGN PATENT DOCUMENTS

CN    111505965 B  *  9/2020  ............ B60W 40/10
CN    113177266 A  *  7/2021
                        (Continued)

OTHER PUBLICATIONS

Wei, et al.; Real-time Simulation and Testing of a Neural Network-based Autonomous Vehicle Trajectory Prediction Model; 2022 18th International Conference on Mobility, Sensing and Networking (MSN); Dec. 14, 2022; https://ieeexplore.ieee.org/document/10084131 (Year: 2022).*

(Continued)

*Primary Examiner* — Atul Trivedi
(74) *Attorney, Agent, or Firm* — Zhigang Ma

(57) ABSTRACT

A simulation test method for autonomous driving vehicle includes steps of: obtaining source data; constructing a simulation scene according to the source data; controlling a virtual vehicle to perform a simulation test in the simulation scene; detecting a virtual driving trajectory of the virtual vehicle at a predetermined time interval while performing the simulation test; calculating difference between a first position and a second position; adjusting perceptual information related to a coordinate of the first position as perceptual information related to a coordinate of the second position to obtain modified perceptual information when the difference exceeds a first preset value; controlling the virtual vehicle to perform the simulation test based on the modified perceptual information, and detecting the virtual driving trajectory of the virtual vehicle at the predetermined time (Continued)

interval again. Furthermore, a computer equipment and a medium are also provided.

20 Claims, 6 Drawing Sheets

(51) Int. Cl.
  *G01M 17/00* (2006.01)
  *G06F 30/20* (2020.01)
(52) U.S. Cl.
  CPC ............. *G01M 17/00* (2013.01); *G06F 30/20* (2020.01); *B60W 2554/4041* (2020.02)
(58) Field of Classification Search
  USPC .......................................................... 701/23
  See application file for complete search history.

(56) References Cited

U.S. PATENT DOCUMENTS

| | | | | |
|---|---|---|---|---|
| 11,415,997 | B1* | 8/2022 | Dolan | G06F 11/3688 |
| 11,663,915 | B2* | 5/2023 | Selvam | G05D 1/0291 |
| | | | | 701/23 |
| 11,667,301 | B2* | 6/2023 | Misra | B60W 60/0011 |
| | | | | 701/23 |
| 2017/0031361 | A1* | 2/2017 | Olson | B60W 40/10 |
| 2017/0168485 | A1* | 6/2017 | Berntorp | G01C 21/26 |
| 2018/0217601 | A1* | 8/2018 | Marcoux | G08G 1/166 |
| 2018/0251126 | A1* | 9/2018 | Linscott | G01C 21/3407 |
| 2019/0113927 | A1* | 4/2019 | Englard | G06F 16/285 |
| 2019/0179979 | A1* | 6/2019 | Melick | G06F 30/367 |
| 2019/0318050 | A1* | 10/2019 | Zapolsky | G01M 17/007 |
| 2020/0001867 | A1* | 1/2020 | Mizutani | G08G 1/166 |
| 2020/0042656 | A1* | 2/2020 | Zapolsky | G06V 20/10 |
| 2020/0130709 | A1* | 4/2020 | Rodionova | G05B 13/042 |
| 2020/0134494 | A1* | 4/2020 | Venkatadri | G06N 3/047 |
| 2020/0180647 | A1* | 6/2020 | Anthony | G06N 3/08 |
| 2020/0210234 | A1* | 7/2020 | Priyadarshi | G05D 1/0094 |
| 2021/0097147 | A1* | 4/2021 | DeVore | G06F 18/22 |
| 2023/0192120 | A1* | 6/2023 | Martin-Bragado | B60W 40/08 |
| | | | | 701/23 |

FOREIGN PATENT DOCUMENTS

| | | | | |
|---|---|---|---|---|
| CN | 113761647 B | * | 6/2023 | |
| GB | 2563400 A | * | 12/2018 | ............ B60R 21/013 |
| GB | 2598411 A | * | 3/2022 | ............ B60W 30/08 |
| JP | 2018060511 A | * | 4/2018 | ............ G01C 21/28 |
| WO | WO-2022184127 A1 | * | 9/2022 | |

OTHER PUBLICATIONS

Nalawade, et al.; Comparison of Simulators based on Scenario-based Testing of Autonomous Vehicles; 2022 International Conference on Smart Generation Computing, Communication and Networking (Smart Gencon); Dec. 23, 2022; https://ieeexplore.ieee.org/document/10084131 (Year: 2022).*

* cited by examiner

SIMULATION TEST METHOD FOR AUTONOMOUS DRIVING VEHICLE, COMPUTER EQUIPMENT AND MEDIUM

CROSS REFERENCE TO RELATED APPLICATION

This non-provisional patent application claims priority under 35 U.S.C. § 119 from Chinese Patent Application No. 202010552057.8 filed on Jun. 17, 2020, the entire content of which is incorporated herein by reference.

TECHNICAL FIELD

The disclosure relates to the field of autonomous driving technology, and in particular to a simulation test method for autonomous driving vehicle, a computer equipment and a medium.

BACKGROUND

In order to know performance of system and potential problems, it is necessary to test reliability, safety and stability of the system of an autonomous driving vehicle. At present, there are two methods to test the system: real road test and virtual simulation. However, the real road test requires more human, material and financial resources and have potential safety risks.

In addition, data of surrounding environment obtained by virtual vehicle will be changed when driving trajectory of the virtual vehicle deviates from real driving trajectory in the virtual simulation, which will affect perceptual information obtained by the virtual vehicle. As a result, the virtual vehicle may not be able to complete the virtual simulation.

SUMMARY

In view of this, it is necessary to provide a simulation test method for autonomous driving vehicle, a computer equipment and a medium. When driving trajectory of virtual vehicle deviates from real driving trajectory in the simulation test, perceptual information obtained by the virtual vehicle will be corrected in time to solve problems caused by the changing trajectory, so as to make the simulation test proceed smoothly.

A first aspect of the disclosure provides a simulation test method for autonomous driving vehicle, wherein the method includes the steps of: obtaining source data, the source data comprising sensor data related to a real vehicle and a real driving trajectory of the real vehicle; constructing a simulation scene according to the source data; controlling a virtual vehicle to perform a simulation test in the simulation scene; detecting a virtual driving trajectory of the virtual vehicle at a predetermined time interval while performing the simulation test; calculating difference between a first position and a second position, wherein the first position is a position of the real driving trajectory of the real vehicle at a current detecting time, and the second position is a position of the virtual driving trajectory of the virtual vehicle at the current detecting time; adjusting perceptual information related to a coordinate of the first position as perceptual information related to a coordinate of the second position to obtain modified perceptual information when the difference exceeds a first preset value; controlling the virtual vehicle to perform the simulation test based on the modified perceptual information, and detecting the virtual driving trajectory of the virtual vehicle at the predetermined time interval again.

A second aspect of the disclosure provides a computer equipment, wherein the computer equipment comprises a memory configured to store program instructions of the simulation test, and a processor configured to execute the program instructions to enable the computer equipment perform a simulation test method for autonomous driving vehicle, wherein the simulation test method for autonomous driving vehicle comprises the steps of: obtaining source data, the source data comprising sensor data related to a real vehicle and a real driving trajectory of the real vehicle; constructing a simulation scene according to the source data; controlling a virtual vehicle to perform a simulation test in the simulation scene; detecting a virtual driving trajectory of the virtual vehicle at a predetermined time interval while performing the simulation test; calculating difference between a first position and a second position, wherein the first position is a position of the real driving trajectory of the real vehicle at a current detecting time, and the second position is a position of the virtual driving trajectory of the virtual vehicle at the current detecting time; adjusting perceptual information related to a coordinate of the first position as perceptual information related to a coordinate of the second position to obtain modified perceptual information when the difference exceeds a first preset value; controlling the virtual vehicle to perform the simulation test based on the modified perceptual information, and detecting the virtual driving trajectory of the virtual vehicle at the predetermined time interval again.

A third aspect of the disclosure provides a medium, wherein the medium comprising program instructions, the program instructions being executed by one or more processors to perform a simulation test method for autonomous driving vehicle, the method comprises the steps of: obtaining source data, the source data comprising sensor data related to a real vehicle and a real driving trajectory of the real vehicle; constructing a simulation scene according to the source data; controlling a virtual vehicle to perform a simulation test in the simulation scene; detecting a virtual driving trajectory of the virtual vehicle at a predetermined time interval while performing the simulation test; calculating difference between a first position and a second position, wherein the first position is a position of the real driving trajectory of the real vehicle at a current detecting time, and the second position is a position of the virtual driving trajectory of the virtual vehicle at the current detecting time; adjusting perceptual information related to a coordinate of the first position as perceptual information related to a coordinate of the second position to obtain modified perceptual information when the difference exceeds a first preset value; controlling the virtual vehicle to perform the simulation test based on the modified perceptual information, and detecting the virtual driving trajectory of the virtual vehicle at the predetermined time interval again.

When the driving trajectory of the virtual vehicle deviates from the real driving trajectory in the simulation test, the perceptual information obtained by the virtual vehicle will be corrected in time to solve problems caused by the changing trajectory, so as to make the simulation test proceed smoothly.

DETAILED DESCRIPTION OF THE EMBODIMENTS

In order to make purpose, technical solution and advantages of the disclosure more clearly, the disclosure is further described in detail in combination with drawings and embodiments. It is understood that the specific embodiments described herein are used only to explain the disclosure and are not used to define it. On the basis of the embodiments in the disclosure, all other embodiments obtained by ordinary technicians in this field without any creative effort are covered by protection of the disclosure.

Terms "first", "second", "third", "fourth", if any, in specification, claims and drawings of this application are used to distinguish similar objects and need not be used to describe any particular order or sequence of priorities. It should be understood that data are interchangeable when appropriate, in other words, the embodiments described can be implemented in order other than what is illustrated or described here. In addition, terms "include" and "have" and any variation of them, can encompass other things. For example, processes, methods, systems, products, or equipment that comprise a series of steps or units need not be limited to those clearly listed, but may include other steps or units that are not clearly listed or are inherent to these processes, methods, systems, products, or equipment.

It is to be noted that description refers to "first", "second", etc. in the disclosure are for descriptive purpose only and neither be construed or implied relative importance nor indicated as implying number of technical features. Thus, feature defined as "first" or "second" can explicitly or implicitly include one or more features. In addition, technical solutions between embodiments may be integrated, but only on the basis that they can be implemented by ordinary technicians in this field. When the combination of technical solutions is contradictory or impossible to be realized, such combination of technical solutions shall be deemed to be non-existent and not within the scope of protection required by the disclosure.

Figure 1:
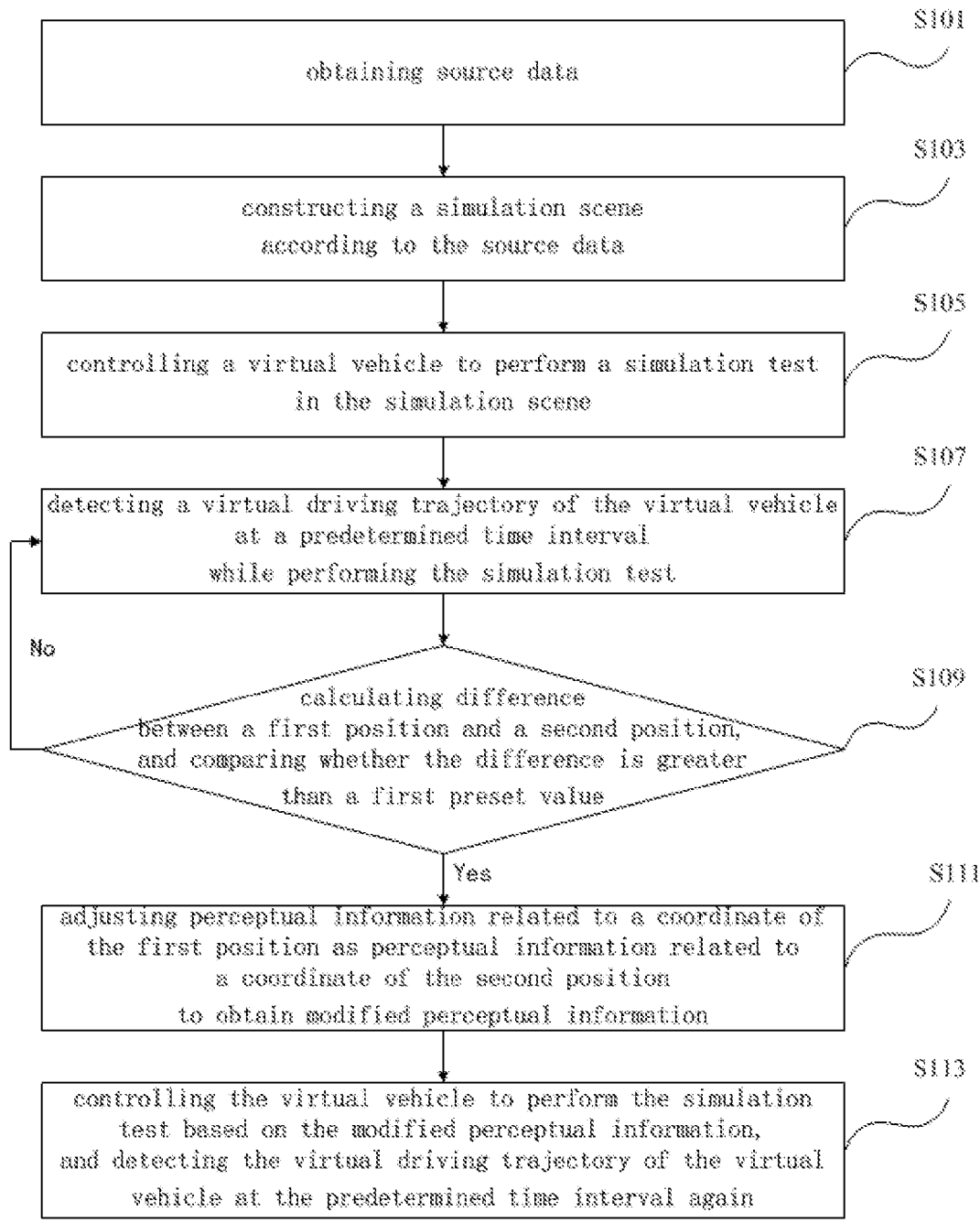
FIG. 1 illustrates the simulation test method for autonomous driving vehicle.
Figure 2A:
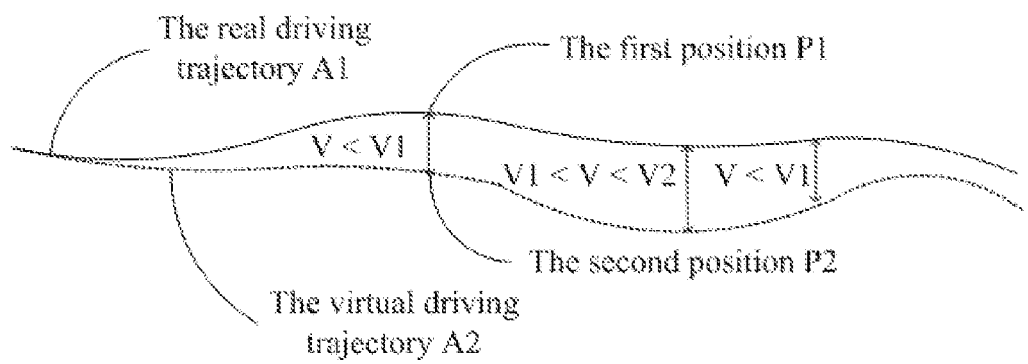
FIG. 2a and FIG. 2b illustrate a schematic diagram of driving trajectory of the simulation test method for autonomous driving vehicle.
Figure 2B:
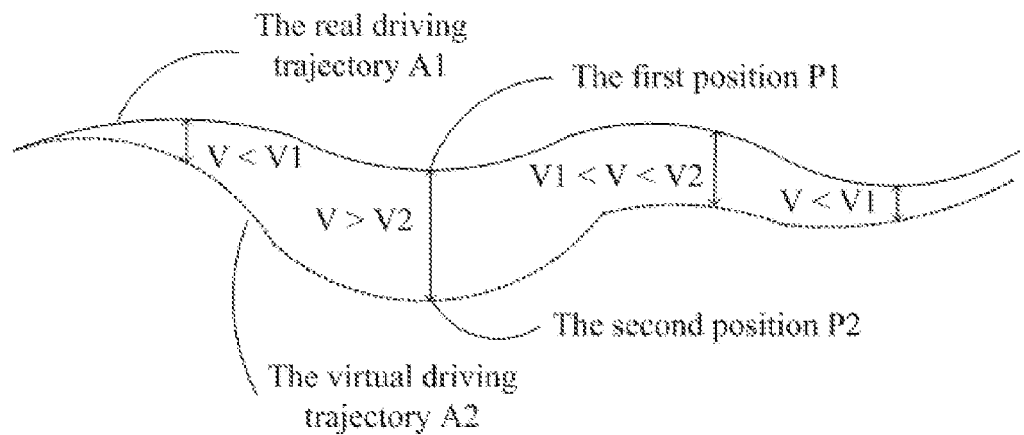

Referring to FIG. 1, FIG. 2a and FIG. 2b, FIG. 1 illustrates the simulation test method for autonomous driving vehicle and FIG. 2a and FIG. 2b illustrate a schematic diagram of driving trajectory of the simulation test method for autonomous driving vehicle. The method of simulation test includes the following steps.

Figure 6:
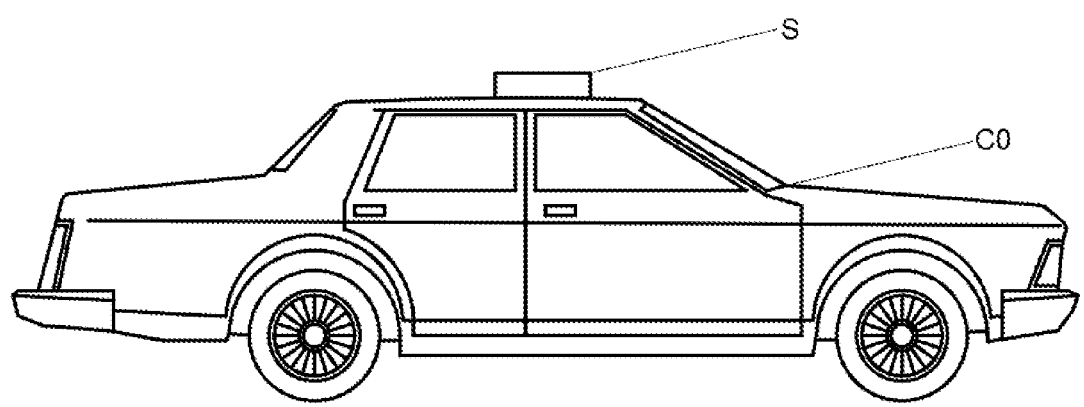
FIG. 6 illustrates an autonomous vehicle with sensing devices.

In step S101, obtaining source data. The source data comprises sensor data related to a real vehicle and a real driving trajectory A1 of the real vehicle. In detail, the source data of the real vehicle includes environment data and path information of the real vehicle C0 (shown in FIG. 6) when the real vehicle C0 travels on real road. The environment data and the path information are recorded by sensing devices S (shown in FIG. 6) and a computing platform system (not shown in drawings) equipped on the real vehicle C0. The environmental data is sensor data related to the real vehicle C0, and the path information is the real driving trajectory A1 of the real vehicle. The real vehicle refers to real vehicle of the source data when collected, and also refers to vehicle that collect the source data in data playback process. The driving of the real vehicle is either autonomous driving or manual driving, or human-machine hybrid driving with manual driving when the real vehicle run into unexpected situation when autonomous driving.

The sensing devices S include but not limited to lidar, millimeter-wave radar and video camera. The source data also includes data generated by the real vehicle during driving, which include but not limited to positioning information, perception information and original driving tracks of the real vehicle during driving. The original driving tracks can also be obtained from data generated by the positioning system set in the real vehicle C0. The positioning information, the perception information and the original driving tracks are in the same coordinate system.

In step S103, constructing a simulation scene according to the source data. In detail, the sensor data recorded by the real vehicle C0 will be played on a simulation platform. The autonomous driving system to be tested in the simulation platform can perform autonomous driving processes according to the sensor data to get final results. The autonomous driving processes include positioning, perception, prediction, decision making, planning, control and so on. Vehicle dynamic model can calculate simulation state such as displacement, direction, speed and acceleration generated by the virtual vehicle at time point of next frame according to the final results. The simulation state is given to the virtual vehicle to form the simulation scene of closed-loop control.

The simulation scene includes but not limited to scene objects and attribute information of the scene objects. The scene objects include road objects, traffic sign objects, driving vehicle objects and pedestrian objects. The attribute information of the scene objects includes traveling direction, traveling speed, traveling state and topology structure.

In addition, the simulation scene also includes a plurality of simulation scenes with different environment modes. A plurality of simulation scenes with different environment modes are generated based on the source data and preset environment modes. In detail, the environment modes include but not limited to rainy day mode, snow day mode, haze mode, sandstorm mode, night mode and so on. In some embodiments, the virtual objects can also be added to the source data manually or automatically, so as to generate virtual-real hybrid simulation scenes. The simulation scene comprises the hybrid simulation scenes. The real data obtained from other plurality of real vehicles with the source data can be mixed to generate real-real hybrid simulation scenes. The real data is obtained by other real vehicles driving the same road or the road with a similar shape shown on the map. So as to improve complexity of road traffic flow.

Figure 7:
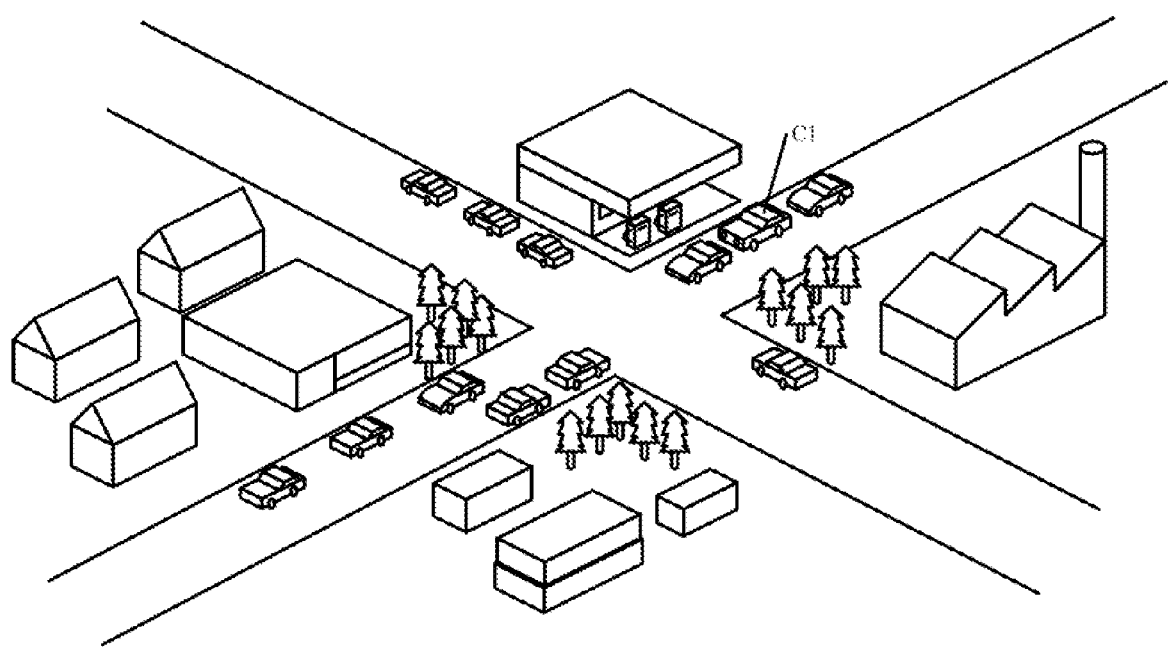
FIG. 7 illustrates a schematic diagram of autonomous driving simulation test.

In step S105, controlling a virtual vehicle C1 (as shown in FIG. 7) to perform a simulation test in the simulation scene. The virtual vehicle C1 generates corresponding simulation control instructions according to the steps of positioning, perception, prediction, planning, decision and control. The simulation control instructions are used to control the virtual vehicle C1 to drive in the simulation scene.

In detail, the positioning step includes to obtain the positioning information of the virtual vehicle C1 based on the sensor data of the real vehicle combining with high-precision map existing in the simulation platform or contained in the source data.

The perception step includes to use perceptual units of the virtual vehicle C1 to calculate the perceptual information around the virtual vehicle C1. Understandably, the perceptual information is calculated in pre-fusion or post-fusion manner. In detail, pre-fusion manner is to fuse the sensor data collected by various sensors of the real vehicle through pre-fusion algorithm of the virtual vehicle C1, and then calculate to get the perception information according to preset perception units on the virtual vehicle C1. Post-fusion manner is to calculate perception data by the perception units of various analog sensors on the virtual vehicle C1, and then fuse the perception data to obtain the perception information through post-fusion algorithm of the virtual vehicle C1.

The prediction step includes to predict the number, position, speed, appearance shape and other parameters of obstacles around the virtual vehicle C1 according to the positioning information and the perception information. Then, possible moving trajectory of the obstacles will be calculated according to the parameters.

The planning step includes to plan a number of reasonable driving routes according to the possible moving trajectory of the obstacles and current states of the virtual vehicle C1.

The decision step includes to choose the best route from a number of reasonable driving routes.

The control step includes to generate control instructions according to the best route, which is used to control driving of virtual vehicle C1. The control instructions include displacement, direction, speed and accelerate of the virtual vehicle C1 at the time point of the next frame, used to control the virtual vehicle C1 to drive in the simulation scene.

In step S107, detecting a virtual driving trajectory A2 of the virtual vehicle at a predetermined time interval T while performing the simulation test. The predetermined time interval T is 30 seconds. Positions of the virtual vehicle is detected and recorded to form driving trajectory of the virtual vehicle A2.

In some embodiments, the predetermined time interval T comprises a first predetermined time interval T1 and a second predetermined time interval T2. The second predetermined time interval T2 is shorter than the first predetermined time interval T1. In some embodiments, the first predetermined time interval T1 is 30 seconds and the second predetermined time interval T2 is 5 seconds.

In step S109, calculating difference V between a first position P1 and a second position P2, wherein the first position P1 is a position of the real driving trajectory A1 of the real vehicle at current detecting time, and the second position P2 is a position of the virtual driving trajectory A2 of the virtual vehicle at the current detecting time. When the difference V exceeds a first preset value V1, perform step S111. Instead, perform step S107. The first preset value V1 includes a first different between the first position and the second position along a first direction perpendicular to a driving direction of the virtual vehicle, and a second different between the first position and the second position along a second direction parallel to the driving direction of the virtual vehicle. The first preset value V1 includes a preset value that is perpendicular to forward direction of the real vehicle and a preset value that is parallel to the forward direction of the real vehicle. In detail, the first preset value V1 is 0.3 meters perpendicular to the forward direction of the real vehicle and 5 meters in the forward direction of the real vehicle.

In step S111, adjusting perceptual information related to a coordinate of the first position P1 as perceptual information related to a coordinate of the second position P2 to obtain modified perceptual information when the difference exceeds a first preset value. In detail, the analog sensor on the virtual vehicle C1 transmits the real sensor data of the first position P1 to the perceptual units on the virtual vehicle C1. The perceptual units process the real sensor data to obtain the perceptual information related to the coordinate of the first position P1, and adjust the perceptual information related to the coordinate of the first position P1 as the perceptual information related to the coordinate of the second position P2. The coordinate of the first position is changed to a coordinate space to which the coordinate of the second position belonged, when a coordinate space to which the coordinate of the first position belonged is different from the coordinate space to which the second position coordinates belonged. In some embodiments, when the final results produced by the various modules of the autonomous driving system are represented in world coordinates (or absolute coordinates rather than relative coordinates), the perceptual information do not require to be adjusted.

In step S113, controlling the virtual vehicle to perform the simulation test based on the modified perceptual information, and perform step S107 again.

In some embodiments, the method of simulation test also includes following steps.

In step S121, setting the predetermined time interval T to the first predetermined time interval T1 when the difference V exceeds the first preset value V1 but does not exceed a second preset value V2. The second preset value V2 is greater than the first preset value V1. The second preset value V2 includes a first different between the first position and the second position along a first direction perpendicular to a driving direction of the virtual vehicle, and a second different between the first position and the second position along a second direction parallel to the driving direction of the virtual vehicle. The second preset value V2 includes a preset value that is perpendicular to forward direction of the virtual vehicle and a preset value that is parallel to the forward direction of the virtual vehicle. In detail, the second preset value V2 is 0.5 meters perpendicular to the forward direction of the virtual vehicle and 15 meters in the forward direction of the virtual vehicle.

In step S122, setting the predetermined time interval T to the second predetermined time interval T2 when the difference V exceeds the second preset value V2.

In step S123, setting the predetermined time interval T to the first predetermined time interval T1 when the difference V is less than the first preset value V1.

The results of many modules are dependent on previous multi-frame data in the autonomous driving simulation system, that is, the vehicle cannot directly start running in a certain frame, but must be initialized with multi-frame data. In detail, it is necessary to confirm "entry point" of the virtual vehicle to start the simulation test. The point of frame at which the virtual vehicle starts to simulate is the "entry point". In this embodiment, the "entry point" can be any time point in the real data. Initialize the autonomous driving system to be tested so as to ensure that state of each module can start to simulate normally. Before controlling the virtual vehicle C1 to perform the simulation test in the simulation scene, this embodiment controls the virtual vehicle C1 to perform a simulation driving in a preset scene. The preset scene is a section of the simulation scene. In this embodiment, driving data of the real vehicle is obtained and the virtual vehicle C1 is controlled to drive in the preset scene following the driving data. In detail, driving state data of the real vehicle at current position and frame are obtained and transformed into the driving state data of the virtual vehicle C1 at the corresponding position and frame. In this embodiment, the state data includes speed, positioning/position, acceleration, direction, and steering, etc. The control instructions of the real vehicle are given to the virtual vehicle C1 to make the virtual vehicle C1 drive in the preset scene. When the virtual vehicle C1 is driving in the preset scene, the method of simulation test is not enabled. The method of simulation test controls the virtual vehicle C1 to perform the simulation test in the simulation scene after that the simulation driving of the virtual vehicle C1 in the preset scene is completed. That is, no matter what control decision of the virtual vehicle is and what resulting state of the virtual vehicle is, the virtual vehicle is "dragged" according to the position of the real vehicle until it reached the "entry point", and then the autonomous driving system is allowed to determine the position and other states of the virtual vehicle independently.

In this embodiment, when there are obstacles on the virtual driving trajectory A2 of the simulation scene are located within the preset range of the virtual vehicle, some obstacles may not interact because they ignore the virtual vehicle, resulting in unreal simulation such as active collision with the virtual vehicle. In view of this, some obstacles in the simulation scene can be deleted. The obstacles can be deleted automatically by the simulation algorithm or manually by editing the simulation scene. The preset range of the virtual vehicle is a preset range perpendicular to left and right sides of driving direction of the virtual vehicle, and a preset range ahead of the driving direction of the virtual vehicle. In this embodiment, the preset range is defined as a range of 0.3 meters perpendicular to the left and right sides of the driving direction of the virtual vehicle, and a range of 10 meters ahead of the driving direction of the virtual vehicle. In some embodiments, a motion and planning model is added for the obstacles to enable the obstacles that can't interact with external objects to interact with the external objects when the obstacles on the virtual driving trajectory of the simulation scene are located within the preset range of the virtual vehicle. The motion and planning model can switch the motion behavior of some obstacles to interactive simulation when unreal non-interactive operations are detected at a certain time point.

Figure 3:
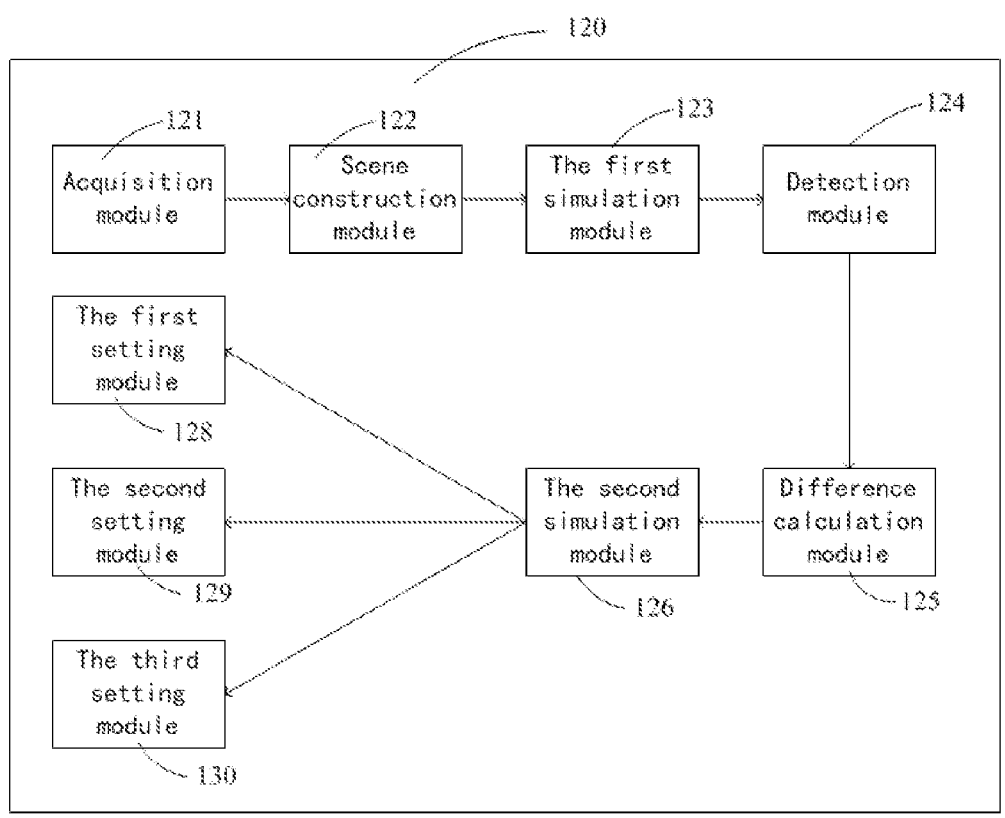
FIG. 3 illustrates a schematic diagram of the simulation test device equipment for autonomous driving vehicle.
Figure 4:
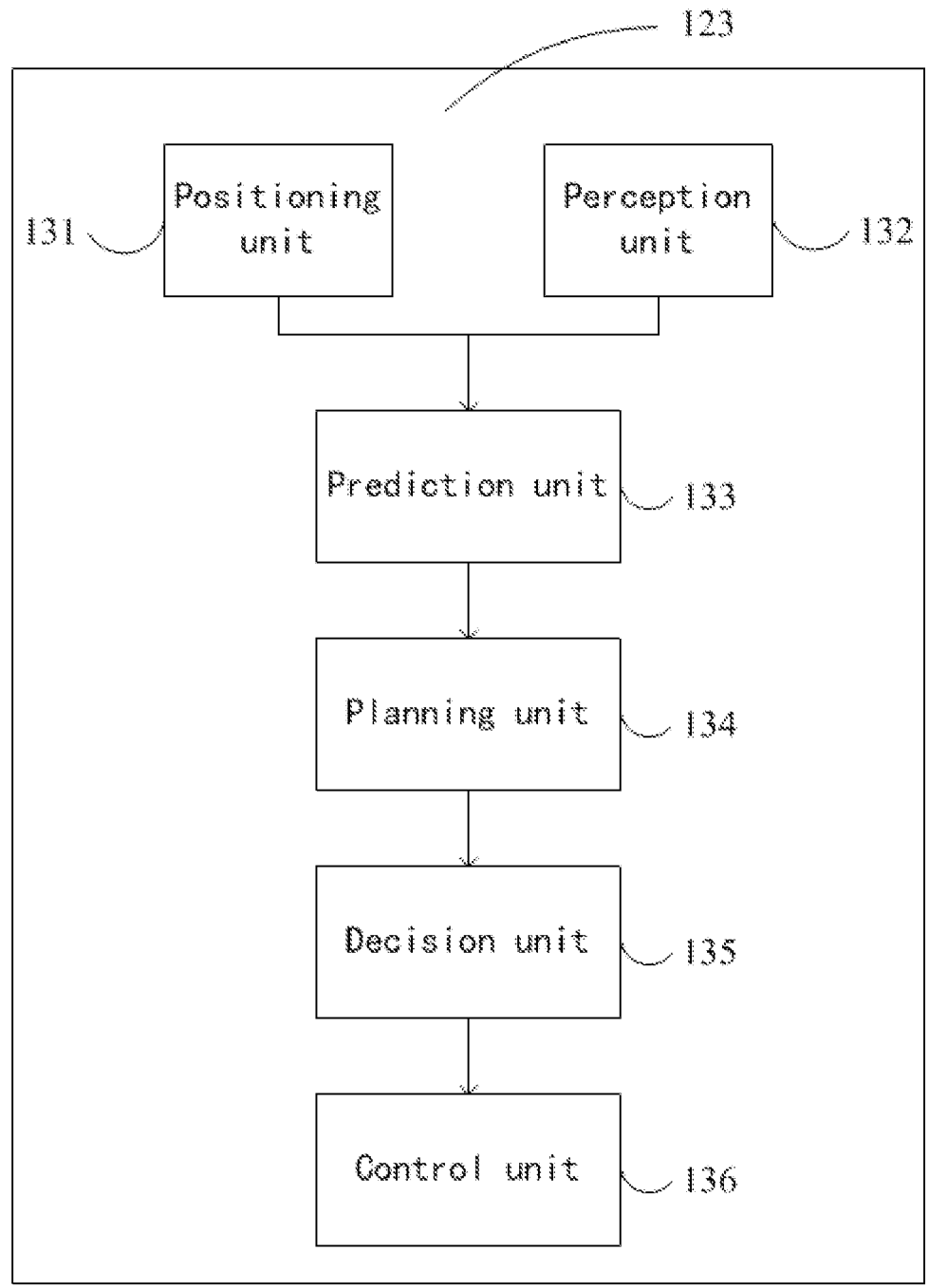
FIG. 4 illustrates a schematic diagram of subunit of a first simulation module.

Referring to FIG. 3 and FIG. 4, FIG. 3 illustrates a schematic diagram of the simulation test device 120 for autonomous driving vehicle and FIG. 4 illustrates a schematic diagram of subunit of a first simulation module 123. The device 120 of the simulation test includes an acquisition module 121, a scene construction module 122, a first simulation module 123, a detection module 124, a difference calculation module 125, a second simulation module 126, a first setting module 128, a second setting module 129 and a third setting module 130.

The acquisition module 121, used to obtain source data. The source data comprises sensor data related to a real vehicle and a real driving trajectory A1 of the real vehicle. In detail, the source data of the real vehicle includes environment data and path information of the real vehicle C0 (shown in FIG. 6) when the real vehicle C0 travels on real road. The environment data and the path information are recorded by sensing devices S (shown in FIG. 6) and a computing platform system (not shown in drawings) equipped on the real vehicle C0. The environmental data is sensor data related to the real vehicle C0, and the path information is the real driving trajectory A1 of the real vehicle. The real vehicle refers to real vehicle of the source data when collected, and also refers to vehicle that collect the source data in data playback process. The driving of the real vehicle is either autonomous driving or manual driving, or human-machine hybrid driving with manual driving when the real vehicle run into unexpected situation when autonomous driving.

The sensing device S includes but not limited to lidar, millimeter-wave radar and video camera. The source data also includes data generated by the real vehicle during driving, which include but not limited to positioning information, perception information and original driving tracks of the real vehicle during driving. The original driving tracks can also be obtained from data generated by the positioning system set in the real vehicle C0. The positioning information, the perception information and the original driving tracks are in the same coordinate system.

The scene construction module 122, used to construct a simulation scene according to the source data. In detail, the sensor data recorded by the real vehicle C0 will be played on simulation platform. The autonomous driving system to be tested in the simulation platform can perform autonomous driving processes according to the sensor data to get final results. The autonomous driving processes include positioning, perception, prediction, decision making, planning, control and so on. Vehicle dynamic model can calculate simulation state such as displacement, direction, speed and acceleration generated by the virtual vehicle at time point of next frame according to the final results. The simulation state is given to the virtual vehicle to form the simulation scene of closed-loop control.

The simulation scene includes but not limited to scene objects and attribute information of the scene objects. The scene objects include road objects, traffic sign objects, driving vehicle objects and pedestrian objects. The attribute information of the scene objects includes traveling direction, traveling speed, traveling state and topology structure.

In addition, the simulation scene also includes a plurality of simulation scenes with different environment modes. A plurality of simulation scenes with different environment modes are generated based on the source data and preset environment modes. In detail, the environment modes include but not limited to rainy day mode, snow day mode, haze mode, sandstorm mode, night mode and so on. In some embodiments, the virtual objects can also be added to the source data manually or automatically, so as to generate virtual-real hybrid simulation scenes. The simulation scene comprises the hybrid simulation scenes. The real data obtained from other plurality of real vehicles with the source data can be mixed to generate real-real hybrid simulation scenes. The real data is obtained by other real vehicles driving the same road or the road with a similar shape shown on the map. So as to improve complexity of road traffic flow.

The first simulation module 123, used to control a virtual vehicle C1 (as shown in FIG. 7) to perform the simulation test in simulation scene. The first simulation module 123 includes a positioning unit 131, a perception unit 132, a prediction unit 133, a planning unit 134, a decision unit 135, and a control unit 136.

The positioning unit 131, used to obtain the positioning information of the virtual vehicle C1 based on the sensor data of the real vehicle combining with high-precision map existing in the simulation platform or contained in the source data.

The perception unit 132, used to calculate the perceptual information around the virtual vehicle C1. Understandably, the perceptual information is calculated in pre-fusion or post-fusion manner. In detail, pre-fusion manner is to fuse the sensor data collected by various sensors of the real vehicle through pre-fusion algorithm of the virtual vehicle C1, and then calculate to get the perception information according to preset perception unit 132 on the virtual vehicle C1 and the high-precision map. Post-fusion manner is to calculate the perception data by the perception units 132 of various analog sensors on the virtual vehicle C1 and the high-precision map, and then fuse the perception data to obtain the perception information through post-fusion algorithm of the virtual vehicle C1.

The prediction unit 133, used to predict the number, position, speed, appearance shape and other parameters of obstacles around the virtual vehicle C1 according to the positioning information and the perception information combining with the high-precision map existing in the simulation platform or contained in the source data. Then, possible moving trajectory of the obstacles will be calculated according to the parameters.

The planning unit 134, used to plan a number of reasonable driving routes according to the possible moving trajectory of the obstacles and current state of the virtual vehicle C1.

The decision unit 135, used to choose the best route from a number of reasonable driving routes.

The control unit 136, used to generate control instructions according to the best route, which is used to control driving of virtual vehicle C1. The control instructions include displacement, direction, speed and accelerate status of the virtual vehicle C1 at the time point of the next frame, used to control the virtual vehicle C1 to drive in the simulation scene.

The detection module 124, used to detect a virtual driving trajectory A2 of the virtual vehicle at a predetermined time interval T while performing the simulation test. The predetermined time interval T is 30 seconds. Positions of the virtual vehicle is detected and recorded to form driving trajectory of the virtual vehicle A2.

In some embodiments, the predetermined time interval T comprises a first predetermined time interval T1 and a second predetermined time interval T2. The second predetermined time interval T2 is shorter than the first predetermined time interval T1. In some embodiments, the first predetermined time interval T1 is 30 seconds and the second predetermined time interval T2 is 5 seconds.

The difference calculation module 125, used to calculate difference V between a first position P1 and a second position P2, wherein the first position P1 is a position of the real driving trajectory A1 of the real vehicle at current detecting time, and the second position P2 is a position of the virtual driving trajectory A2 of the virtual vehicle at the current detecting time. When the difference V exceeds a first preset value V1, run the second simulation module 126. Instead, run the detection module 124. The first preset value V1 includes a first different between the first position and the second position along a first direction perpendicular to a driving direction of the virtual vehicle, and a second different between the first position and the second position along a second direction parallel to the driving direction of the virtual vehicle. The first preset value V1 includes a preset value that is perpendicular to forward direction of the real vehicle and a preset value that is parallel to the forward direction of the real vehicle. In detail, the first preset value V1 is 0.3 meters perpendicular to the forward direction of the real vehicle and 5 meters in the forward direction of the real vehicle.

The second simulation module 126, used to adjust perceptual information related to a coordinate of the first position P1 as perceptual information related to a coordinate of the second position P2 to obtain modified perceptual information when the difference exceeds a first preset value.

Then the second simulation module 126 control the virtual vehicle to perform simulation test by using the modified perception information, and send detection signal to the detection module 124 to continue to run the detection module 124. In detail, the analog sensor on the virtual vehicle C1 transmits the real sensor data of the first position P1 to the perceptual unit 132 on the virtual vehicle C1. The perceptual unit 132 processes the real sensor data to obtain the perceptual information related to the coordinate of the first position P1, and adjust the perceptual information related to the coordinate of the first position P1 to the perceptual information related to the coordinate of the second position P2. The coordinate of the first position is changed to a coordinate space to which the coordinate of the second position belonged, when a coordinate space to which the coordinate of the first position belonged is different from the coordinate space to which the second position coordinates belonged. In some embodiments, when the final results produced by the various modules of the autonomous driving system are represented in world coordinates (or absolute coordinates rather than relative coordinates), the perceptual information do not require to be adjusted.

The first setting module 128, used to set the predetermined time interval T to the first predetermined time interval T1 when the difference V exceeds the first preset value V1 but does not exceed a second preset value V2. The second preset value V2 is greater than the first preset value V1. The second preset value V2 is greater than the first preset value V1. The second preset value V2 includes a first different between the first position and the second position along a first direction perpendicular to a driving direction of the virtual vehicle, and a second different between the first position and the second position along a second direction parallel to the driving direction of the virtual vehicle. The second preset value V2 includes a preset value that is perpendicular to forward direction of the virtual vehicle and a preset value that is parallel to the forward direction of the virtual vehicle. In detail, the second preset value V2 is 0.5 meters perpendicular to the forward direction of the virtual vehicle and 15 meters in the forward direction of the virtual vehicle.

The second setting module 129, used to set the predetermined time interval T to the second predetermined time interval T2 when the difference V exceeds the second preset value V2.

The third setting module 130, used to set the predetermined time interval T to the first predetermined time interval T1 when the difference V is less than the first preset value V1.

In this embodiment, before controlling the virtual vehicle C1 to perform the simulation test in the simulation scene, this embodiment controls the virtual vehicle C1 to perform a simulation driving in the preset scene. The preset scene is a section of the simulation scene. In this embodiment, driving data of the real vehicle is obtained and the virtual vehicle C1 is controlled to drive in the preset scene following the driving data. In detail, driving state data of the real vehicle at current position and frame are obtained and transformed into the driving state data of the virtual vehicle C1 at the corresponding position and frame. In this embodiment, the state data includes speed, positioning/position, acceleration, direction, and steering, etc. The control instructions of the real vehicle are given to the virtual vehicle C1 to make the virtual vehicle C1 drive in the preset scene. When the virtual vehicle C1 is driving in the preset scene, the method of simulation test is not enabled. The method of simulation test controls the virtual vehicle C1 to perform the simulation test in the simulation scene after that the simulation driving of the virtual vehicle C1 in the preset scene is completed. That is, no matter what control decision of the virtual vehicle is and what resulting state of the virtual vehicle is, the virtual vehicle is "dragged" according to the position of the real vehicle until it reached the "entry point", and then the autonomous driving system is allowed to determine the position and other states of the virtual vehicle independently.

In this embodiment, when there are obstacles on the virtual driving trajectory A2 of the simulation scene are located within the preset range of the virtual vehicle, some obstacles may not interact because they ignore the virtual vehicle, resulting in unreal simulation such as active collision with the virtual vehicle. In view of this, some obstacles in the simulation scene can be deleted. The obstacles can be deleted automatically by the simulation algorithm or manually by editing the simulation scene. The preset range of the virtual vehicle is a preset range perpendicular to left and right sides of driving direction of the virtual vehicle, and a preset range ahead of the driving direction of the virtual vehicle. In this embodiment, the preset range is defined as a range of 0.3 meters perpendicular to the left and right sides of the driving direction of the virtual vehicle, and a range of 10 meters ahead of the driving direction of the virtual vehicle. In some embodiments, a motion and planning model is added for the obstacles to enable the obstacles that can't interact with external objects to interact with the external objects when the obstacles on the virtual driving trajectory of the simulation scene are located within the preset range of the virtual vehicle. The motion and planning model can switch the motion behavior of some obstacles to interactive simulation when unreal non-interactive operations are detected at a certain time point.

Figure 5:
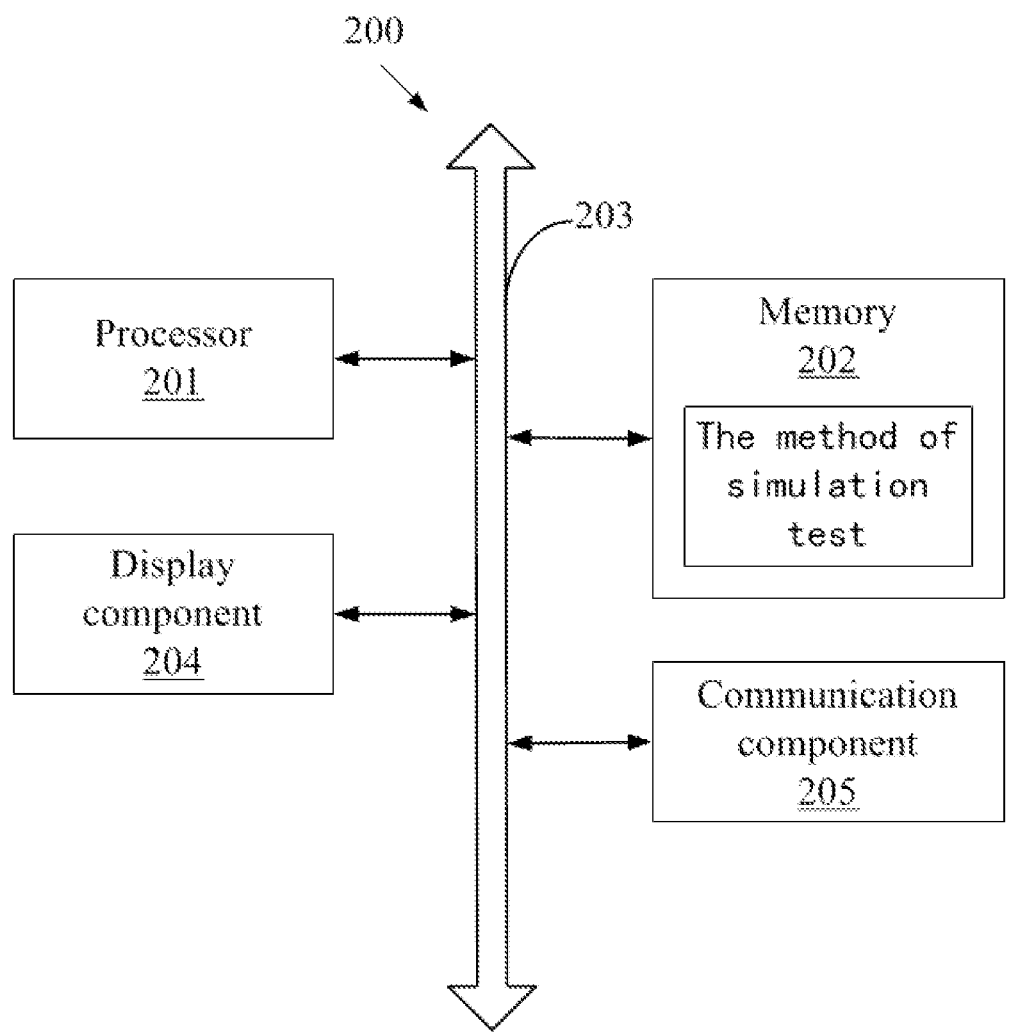
FIG. 5 illustrates a schematic diagram of the computer equipment.

Referring to FIG. 5, FIG. 5 illustrates a schematic diagram of the computer equipment. The computer equipment 200 includes a processor 201, a memory 202, and a bus 203. The memory 202 is configured to store program instructions of the simulation test, and the processor 201 is configured to execute the program instructions to enable the computer equipment perform a simulation test method for autonomous driving vehicle.

The processor 201 in some embodiments may be a Central Processing Unit (CPU), controller, microcontroller, microprocessor, or other data processing chip used to run program code or process data stored in the memory 202.

The memory 202 includes at least one type of readable storage medium, which includes flash memory, hard disk, multimedia card, card-type memory (for example, SD or DX memory, etc.), magnetic memory, disk, optical disc, etc. The memory 202 in some embodiments may be an internal storage unit of a computer device, such as a hard disk of a computer device. The memory 202, in other embodiments, can also be a storage device for external computer devices, such as a plug-in hard disk, a Smart Media Card (SMC), a Secure Digital (SD) Card, a Flash Card, etc. equipped on a computer device. Further, the memory 202 may include both the internal and external storage units of a computer device. The memory 202 can not only be used to store the application software and all kinds of data installed in the computer equipment, but also can be used to temporarily store the data that has been output or will be output.

The bus 203 can be either a peripheral component interconnect (PCI) bus or an extended industry standard architecture (EISA) bus. The bus can be divided into address bus, data bus, control bus and so on. For ease of representation, FIG. 5 is represented by a single thick line, but does not indicate that there is only one bus or one type of bus.

Further, the computer equipment 200 may also include a display component 204. The display component 204 can be LED display, LCD display, touch LCD display and OLED (Organic Light-Emitting Diode) touchscreen, etc. The display component 204 may also be appropriately called the display device or display unit for displaying the information processed in the computer equipment 200 and for displaying the visual user interface.

Further, the computer equipment 200 may also include a communication component 205. Optionally, the communication component 205 may include a wired communication component and/or a wireless communication component (for example, a WI-FI communication component, a Bluetooth communication component, etc.), which is usually used to establish a communication connection between the computer equipment 200 and other computer devices.

FIG. 5 shows the computer equipment 200 only with components 201-205. To the understanding of technicians in this field, the structure shown in FIG. 5 does not constitute a qualification for computer equipment 200, which may include fewer or more components than illustrated, or some combination of components, or a different arrangement of components.

A medium comprises program instructions, the program instructions being executed by one or more processors to perform a simulation test method for autonomous driving vehicle.

In the above embodiments, it may be achieved in whole or in part by software, hardware, firmware, or any combination thereof. When implemented in software, it can be implemented in whole or in part as a computer program product.

The computer program product includes one or more computer instructions. When the computer program instructions are loaded and executer on a computer, a process or function according to the embodiment of the disclosure is generated in whole or in part. The computer device may be a general-purpose computer, a dedicated computer, a computer network, or other programmable device. The computer instruction can be stored in a computer readable storage medium, or transmitted from one computer readable storage medium to another computer readable storage medium. For example, the computer instruction can be transmitted from a web site, computer, server, or data center to another web site, computer, server, or data center through the cable (such as a coaxial cable, optical fiber, digital subscriber line) or wireless (such as infrared, radio, microwave, etc.). The computer readable storage medium can be any available medium that a computer can store or a data storage device such as a serve or data center that contains one or more available media integrated. The available media can be magnetic (e.g., floppy Disk, hard Disk, tape), optical (e.g., DVD), or semiconductor (e.g., Solid State Disk), etc.

The technicians in this field can clearly understand the specific working process of the system, device and unit described above, for convenience and simplicity of description, can refer to the corresponding process in the embodiment of the method described above, and will not be repeated here.

In the several embodiments provided in this disclosure, it should be understood that the systems, devices and methods disclosed may be implemented in other ways. For example, the device embodiments described above is only a schematic. For example, the division of the units, just as a logical functional division, the actual implementation can have other divisions, such as multiple units or components can be combined with or can be integrated into another system, or some characteristics can be ignored, or does not perform. Another point, the coupling or direct coupling or communication connection shown or discussed may be through the indirect coupling or communication connection of some interface, device or unit, which may be electrical, mechanical or otherwise.

The unit described as a detached part may or may not be physically detached, the parts shown as unit may or may not be physically unit, that is, it may be located in one place, or it may be distributed across multiple network units. Some or all of the units can be selected according to actual demand to achieve the purpose of this embodiment scheme.

In addition, the functional units in each embodiment of this disclosure may be integrated in a single processing unit, or may exist separately, or two or more units may be integrated in a single unit. The integrated units mentioned above can be realized in the form of hardware or software functional units.

The integrated units, when implemented as software functional units and sold or used as independent product, can be stored in a computer readable storage medium. Based on this understanding, the technical solution of this disclosure in nature or the part contribute to existing technology or all or part of it can be manifested in the form of software product. The computer software product stored on a storage medium, including several instructions to make a computer equipment (may be a personal computer, server, or network device, etc.) to perform all or part of steps of each example embodiments of this disclosure. The storage medium mentioned before includes U disk, floating hard disk, ROM (Read-Only Memory), RAM (Random Access Memory), floppy disk or optical disc and other medium that can store program codes.

It should be noted that the embodiments number of this disclosure above is for description only and do not represent the advantages or disadvantages of embodiments. And in this disclosure, the term "including", "include" or any other variants is intended to cover a non-exclusive contain. So that the process, the devices, the items, or the methods includes a series of elements not only include those elements, but also include other elements not clearly listed, or also include the inherent elements of this process, devices, items, or methods. In the absence of further limitations, the elements limited by the sentence "including a . . . " do not preclude the existence of other similar elements in the process, devices, items, or methods that include the elements.

The above are only the preferred embodiments of this disclosure and do not therefore limit the patent scope of this disclosure. And equivalent structure or equivalent process transformation made by the specification and the drawings of this disclosure, either directly or indirectly applied in other related technical fields, shall be similarly included in the patent protection scope of this disclosure.

The invention claimed is:

1. A simulation test method for autonomous driving vehicle, the method comprises:
   obtaining source data, the source data comprising sensor data related to a real vehicle and a real driving trajectory of the real vehicle;
   constructing a simulation scene according to the source data;
   controlling a virtual vehicle to perform a simulation test in the simulation scene;
   detecting a virtual driving trajectory of the virtual vehicle at a predetermined time interval while performing the simulation test;
   calculating difference between a first position and a second position, wherein the first position is a position of the real driving trajectory of the real vehicle at a current detecting time, and the second position is a position of the virtual driving trajectory of the virtual vehicle at the current detecting time;
   adjusting perceptual information related to a coordinate of the first position as perceptual information related to a coordinate of the second position to obtain modified perceptual information when the difference exceeds a first preset value; and
   controlling the virtual vehicle to perform the simulation test based on the modified perceptual information, and detecting the virtual driving trajectory of the virtual vehicle at the predetermined time interval again.

2. The method as claimed in claim 1, further comprising:
   setting the predetermined time interval to a first predetermined time interval when the difference exceeds the first preset value but does not exceed a second preset value, the second preset value is greater than the first preset value; or
   setting the predetermined time interval to a second predetermined time interval when the difference exceeds the second preset value, the second predetermined time interval is shorter than the first predetermined time interval; or
   setting the predetermined time interval to the first predetermined time interval when the difference is less than the first preset value.

3. The method as claimed in claim 2, wherein each of the first preset value and the second preset value includes a first different between the first position and the second position along a first direction perpendicular to a driving direction of the virtual vehicle, and a second different between the first position and the second position along a second direction parallel to the driving direction of the virtual vehicle.

4. The method as claimed in claim 1, wherein before controlling a virtual vehicle to perform a simulation test in the simulation scene, the method further comprises:
   controlling the virtual vehicle to perform a simulation driving in a preset scene; and
   controlling the virtual vehicle to perform the simulation test in the simulation scene after that the simulation driving of the virtual vehicle in the preset scene is completed.

5. The method as claimed in claim 4, wherein the preset scene is a section of the simulation scene.

6. The method as claimed in claim 4, wherein controlling the virtual vehicle to perform a simulation driving in a preset scene comprises:
   obtaining driving data of the real vehicle; and
   controlling the virtual vehicle to drive in the preset scene following the driving data.

7. The method as claimed in claim 1, wherein constructing a simulation scene according to the source data comprises:
   generating a plurality of simulation scenes with different environment modes base on the source data and preset environment modes, the simulation scene comprising the plurality of simulation scenes with different environment modes; or
   generating virtual-real hybrid simulation scenes by adding virtual objects to the source data manually or automatically, the simulation scene comprising the hybrid simulation scenes; or generating real-real hybrid simulation scenes by mixing real data obtained from other plurality of real vehicles with the source data, the real data is obtained by other real vehicles driving the same road or the road with a similar shape shown on the map.

8. The method as claimed in claim 1, further comprising:
deleting obstacles in the simulation scene when the obstacles on the virtual driving trajectory of the simulation scene are located within a preset range of the virtual vehicle.

9. The method as claimed in claim 1, further comprising:
adding a motion and planning model for the obstacles to enable the obstacles that can't interact with external objects to interact with the external objects when the obstacles on the virtual driving trajectory of the simulation scene are located within the preset range of the virtual vehicle.

10. The method as claimed in claim 1, further comprising:
changing the coordinate of the first position to a coordinate space to which the coordinate of the second position belonged, when a coordinate space to which the coordinate of the first position belonged is different from the coordinate space to which the second position coordinates belonged.

11. A computer equipment, comprising:
a memory configured to store program instructions of the simulation test, and
a processor configured to execute the program instructions to enable the computer equipment perform a simulation test method for autonomous driving vehicle, wherein the simulation test method for autonomous driving vehicle comprises:
obtaining source data, the source data comprising sensor data related to a real vehicle and a real driving trajectory of the real vehicle;
constructing a simulation scene according to the source data;
controlling a virtual vehicle to perform a simulation test in the simulation scene;
detecting a virtual driving trajectory of the virtual vehicle at a predetermined time interval while performing the simulation test;
calculating difference between a first position and a second position, wherein the first position is a position of the real driving trajectory of the real vehicle at current detecting time, and the second position is a position of the virtual driving trajectory of the virtual vehicle at the current detecting time;
adjusting perceptual information related to a coordinate of the first position as perceptual information related to a coordinate of the second position to obtain modified perceptual information when the difference exceeds a first preset value; and
controlling the virtual vehicle to perform the simulation test based on the modified perceptual information, and detecting the virtual driving trajectory of the virtual vehicle at the predetermined time interval again.

12. The computer equipment as claimed in claim 11, further comprising:
setting the predetermined time interval to a first predetermined time interval when the difference exceeds the first preset value but does not exceed a second preset value, the second preset value is greater than the first default value; or
setting the predetermined time interval to a second predetermined time interval when the difference exceeds the second preset value, the second predetermined time interval is shorter than the first predetermined time interval; or
setting the predetermined time interval to the first predetermined time interval when the difference is less than the first preset value.

13. The computer equipment as claimed in claim 12, wherein each of the first preset value and the second preset value includes a first different between the first position and the second position along a first direction perpendicular to a driving direction of the virtual vehicle, and a second different between the first position and the second position along a second direction parallel to the driving direction of the virtual vehicle.

14. The computer equipment as claimed in claim 11, wherein before controlling a virtual vehicle to perform a simulation test in the simulation scene, the computer equipment further comprises:
controlling the virtual vehicle to perform a simulation driving in a preset scene; and
controlling the virtual vehicle to perform the simulation test in the simulation scene after that the simulation driving of the virtual vehicle in the preset scene is completed.

15. The computer equipment as claimed in claim 14, wherein controlling the virtual vehicle to perform a simulation driving in a preset scene comprises:
obtaining driving data of the real vehicle; and
controlling the virtual vehicle to drive in the preset scene following the driving data.

16. The computer equipment as claimed in claim 11, wherein constructing a simulation scene according to the source data comprises:
generating a plurality of simulation scenes with different environment modes base to the source data and preset environment modes, the simulation scene comprising the plurality of simulation scenes with different environment modes; or
generating virtual-real hybrid simulation scenes by adding virtual objects to the source data manually or automatically, the simulation scene comprising the hybrid simulation scenes; or
generating real-real hybrid simulation scenes by mixing real data obtained from other plurality of real vehicles with the source data, the real data is obtained by other real vehicles driving the same road or the road with a similar shape shown on the map.

17. The computer equipment as claimed in claim 11, further comprising:
deleting obstacles in the simulation scene when the obstacles on the virtual driving trajectory of the simulation scene are located within a preset range of the virtual vehicle.

18. The computer equipment as claimed in claim 11, further comprising:
adding a motion and planning model for the obstacles to enable the obstacles that can't interact with external objects to interact with the external objects when the obstacles on the virtual driving trajectory of the simulation scene are located within the preset range of the virtual vehicle.

19. The computer equipment as claimed in claim 11, further comprising:
changing the coordinate of the first position to a coordinate space to which the coordinate of the second position belonged, when a coordinate space to which the coordinate of the first position belonged is different from the coordinate space to which the second position coordinates belonged.

20. A medium, the medium comprising program instructions, the program instructions being executed by one or more processors to perform a simulation test method for autonomous driving vehicle, the method comprises:

obtaining source data, the source data comprising sensor data related to a real vehicle and a real driving trajectory of the real vehicle;

constructing a simulation scene according to the source data;

controlling a virtual vehicle to perform a simulation test in the simulation scene;

detecting a virtual driving trajectory of the virtual vehicle at a predetermined time interval while performing the simulation test;

calculating difference between a first position and a second position, wherein the first position is a position of the real driving trajectory of the real vehicle at a current detecting time, and the second position is a position of the virtual driving trajectory of the virtual vehicle at the current detecting time;

adjusting perceptual information related to a coordinate of the first position as perceptual information related to a coordinate of the second position to obtain modified perceptual information when the difference exceeds a first preset value; and controlling the virtual vehicle to perform the simulation test based on the modified perceptual information, and detecting the virtual driving trajectory of the virtual vehicle at the predetermined time interval again.

* * * * *